US012300531B2

(12) United States Patent
Lee (10) Patent No.: US 12,300,531 B2
(45) Date of Patent: May 13, 2025

(54) SUPPORT UNIT, HEATING UNIT AND SUBSTRATE TREATING APPARATUS INCLUDING THE SAME

(71) Applicant: SEMES CO., LTD., Cheonan-si (KR)

(72) Inventor: Chung Woo Lee, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 277 days.

(21) Appl. No.: 17/870,283

(22) Filed: Jul. 21, 2022

(65) Prior Publication Data

US 2023/0029721 A1 Feb. 2, 2023

(30) Foreign Application Priority Data

Jul. 28, 2021 (KR) .................. 10-2021-0099231

(51) Int. Cl.
*H01L 21/683* (2006.01)
*H01J 37/32* (2006.01)
(Continued)

(52) U.S. Cl.
CPC ...... *H01L 21/6833* (2013.01); *H01J 37/3244* (2013.01); *H01J 37/32477* (2013.01);
(Continued)

(58) Field of Classification Search
CPC .................. B23Q 3/15; H01J 2237/0206; H01J 37/3244; H01J 37/32477; H01J 37/32724;
(Continued)

(56) References Cited

U.S. PATENT DOCUMENTS 7,692,959 B2 4/2010 Krusin-Elbaum et al.
2018/0088066 A1* 3/2018 Schmidt .................. H05B 3/28

FOREIGN PATENT DOCUMENTS

JP 2012-097356 A 5/2012
JP 2014525662 A 9/2014
(Continued)

OTHER PUBLICATIONS

Japanese Office Action, dated Aug. 1, 2023, issued in corresponding Japanese Patent Application No. 2022-117156.
(Continued)

*Primary Examiner* — Philip C Tucker
*Assistant Examiner* — Brian R Slawski
(74) *Attorney, Agent, or Firm* — Harness, Dickey & Pierce, P.L.C.

(57) ABSTRACT

The inventive concept provides a support unit for supporting a substrate. The support unit includes a heating unit for heating the substrate, and wherein the heating unit includes: a plurality of heating members; and a plurality of first power lines and a plurality of second power lines providing a supply and return pathway for a power to and from the plurality of heating members, and wherein the plurality of second power lines are connected to each of the plurality of first power lines through the plurality of heating members, and at least two heating members are connected to each first power line and at least two heating members are connected to each second power line, and at least two heating members are connected in parallel between each first power line and each second power line.

19 Claims, 6 Drawing Sheets

(51) Int. Cl.
*H05B 1/02* (2006.01)
*H05B 3/22* (2006.01)

(52) U.S. Cl.
CPC ...... *H01J 37/32724* (2013.01); *H05B 1/0233* (2013.01); *H05B 3/22* (2013.01); *H01J 2237/0206* (2013.01); *H05B 2203/007* (2013.01)

(58) Field of Classification Search
CPC ......... H01L 21/67069; H01L 21/67103; H01L 21/67213; H01L 21/6833; H02N 13/00; H05B 1/0233; H05B 2203/007; H05B 3/0023; H05B 3/143; H05B 3/22; H05B 3/28
USPC ....... 118/728, 725, 724; 156/345.51, 345.52; 219/443.1, 444.1, 465.1, 468.1, 538, 539
See application file for complete search history.

(56) References Cited

FOREIGN PATENT DOCUMENTS

| | | |
|---|---|---|
| KR | 10-2006-0033241 A | 4/2006 |
| KR | 10-2014-0063840 A | 5/2014 |
| KR | 10-2014-0084010 A | 7/2014 |
| KR | 102084808 B1 | 5/2020 |
| KR | 10-2020-0083927 A | 7/2020 |
| TW | 201304039 A | 1/2013 |

OTHER PUBLICATIONS

Office Action for Taiwanese Application No. 11220520650 dated May 30, 2023.
Office Action for Korean Application No. 10-2021-0099231 dated Apr. 14, 2023.
Notice of Allowance for Korean Application No. 10-2021-0099231 dated Mar. 27, 2024.

* cited by examiner

SUPPORT UNIT, HEATING UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2021-0099231 filed on Jul. 28, 2021, in the Korean Intellectual Property Office, the entire contents of which are hereby incorporated by reference.

BACKGROUND

Embodiments of the inventive concept described herein relate to a support unit, a heating unit and a substrate treating apparatus including the same, more specifically, a heating unit having a relatively simple matrix configuration and a substrate treating apparatus including the same.

An integrated circuit device including a semiconductor device or a display device including a flat display device may be manufactured by using a substrate treating apparatus including various process chambers such as a deposition chamber, a sputtering chamber, an etching chamber, a cleaning chamber, and a drying chamber. In such a process chamber, a support unit in which a substrate is placed on a top part, and a heating unit having a matrix configuration capable of heating the substrate may be provided.

A conventional heating unit of a matrix configuration has a configuration in which a plurality of diodes connected to a plurality of heaters are all arranged in one direction, and requires control lines of a sum of the numbers of columns and rows of the matrix to operate each of the plurality of heaters. When the number of heaters of the heating unit increases, wirings for an electrical connection of the substrate treating apparatus including the heating unit may become complicated, a configuration complexity may be increased, and thus it may be difficult to implement the substrate treating apparatus including the heating unit.

SUMMARY

Embodiments of the inventive concept provide a heating unit capable of reducing the number of control lines to have a relatively simple matrix configuration.

Embodiments of the inventive concept provide a substrate treating apparatus including a heating unit capable of reducing the number of control lines to have a relatively simple matrix configuration.

Embodiments of the inventive concept provide a heating unit capable of controlling more heaters through a same number of control lines.

The technical objectives of the inventive concept are not limited to the above-mentioned ones, and the other unmentioned technical objects will become apparent to those skilled in the art from the following description.

The inventive concept provides a support unit for supporting a substrate. The support unit includes a heating unit for heating the substrate, and wherein the heating unit comprises: a plurality of heating members; and a plurality of first power lines and a plurality of second power lines providing a supply and return pathway for a power to and from the plurality of heating members, and wherein the plurality of second power lines are connected to each of the plurality of first power lines through the plurality of heating members, and at least two heating members are connected to each first power line and at least two heating members are connected to each second power line, and at least two heating members are connected in parallel between each first power line and each second power line.

In an embodiment, there are L heating members connected in parallel between each first power line and each second power line, there are N of the plurality of first power lines, and there are M of the plurality of second power lines, and wherein a total number of the plurality of heating members is N*M*L.

In an embodiment, the support unit further includes a power unit connected to the plurality of first power lines and the plurality of second power lines for supplying a power to the plurality of heating members, and the power unit includes a power source provided in a same number as the at least two heating members connected in parallel between each first power line and each second power line.

In an embodiment, the heating member includes a heating element and a diode connected in series, and at least two diodes are connected in parallel to each other at a point each of the plurality of first power lines and each of the plurality of second power lines each cross with each other, and the at least two diodes are connected to a corresponding heating element such that a current flows in an opposite direction with respect to each first power line and each second power line.

In an embodiment, the heating unit includes a first power supply-return selection switching element connected between the power unit and each first power line; and a second power supply-return selection switching element connected between the power unit and each second power line.

In an embodiment, each of the first power supply-return selection switching element and the second power supply-return selection switching element is provided in a same number as the least two heating members connected in parallel between each first power line and each second power line.

In an embodiment, each power source of the power unit is connected between a corresponding first power supply-return selection switching element and a corresponding second power supply-return switching element.

In an embodiment, the support unit further includes a controller for controlling an on/off of the first power supply-return selection switching element and the second power supply-return selection switching element.

In an embodiment, the at least two heating members connected in parallel between each first power line and each second power line includes a first heating member and a second heating member, and wherein the heating unit further comprises: a power unit connected to the plurality of first power lines and the plurality of second power lines, and including first power source for supplying a power to the first heating member and a second power source for supplying a power to the second heating member; a first power supply-return selection switching element including a first switching element connected between the first power source and each first power line and a second switching element connected between the second power source and each first power line; and a second power supply-return selection switching element including a third switching element connected between the first power source and each second power line and a fourth switching element connected between the second power source and each second power line.

In an embodiment, the first heating member and the second heating member each include a heating member and a diode connected in series, and a diode of the first heating member and a diode of the second heating member are connected to a corresponding heating member such that a current flows in an opposite direction with respect to each first power line which is commonly connected.

In an embodiment, the support unit further includes a controller controlling an on/off of the first power supply-return selection switching element and the second power supply-return selection switching element.

The inventive concept provides a heating unit. The heating unit includes a plurality of heating line assemblies; a plurality of first power lines connected to any one of the plurality of heating line assemblies; a plurality of second power lines connected to any one of the plurality of heating line assemblies; a first power source provided so a current is supplied to a first power line and so a current returns to a second power line; and a second source power provided so a current is supplied to the second power line and so a current returns to the first power line; and wherein only one heating line assembly simultaneously connected to any one first power line among the plurality of first power lines and any one second power line among the plurality of second power lines is provided, and wherein a heating line assembly comprises: a first heating line; a second heating line connected in parallel to the first heating line; a first heater provided at the first heating line; a second heater provided at the second heating line; a first diode connected in series to the first heater at the first heating line; a second diode connected in series to the second heater at the second heating line; and a switch unit for controlling an on/off of the first heater and the second heater included in the heating line assembly.

In an embodiment, the first diode and the second diode included in the heating line assembly are connected so a current flowing in the first heater and a current flowing in the second heater flow in opposite directions with each other.

In an embodiment, the switch unit includes a first power supply-return selection switching element including a first switching element connected between the first power source and each first power line and a second switching element connected between the second power source and each first power line; and a second power supply-return selection switching element including a third switching element connected between the first power source and each second power line and a fourth switching element connected between the second power source and each second power line.

In an embodiment, the heating unit further includes a controller for controlling an on/off of the first switching element, the second switching element, the third switching element and the fourth switching element.

The inventive concept provides a substrate treating apparatus. The substrate treating apparatus includes a process chamber having a treating space; a support unit positioned within the treating space and supporting a substrate; a heating unit provided at the support unit; a gas supply unit for supplying a gas for treating the substrate to the treating space; and a plasma generating unit for generating a plasma from the gas.

In an embodiment, the support unit further comprises a connection board which may be embedded with at least one of a plurality of first power lines and a plurality of second power lines.

In an embodiment, the plurality of first power lines and the plurality of second power lines are embedded on a same place as the heating unit.

In an embodiment, the plasma generation unit includes a gas dispersion plate fixed to the process chamber by a support unit.

In an embodiment, a bottom surface of the gas dispersion plate is anodized to prevent an arc generation by a plasma.

According to an embodiment of the inventive concept, a heating unit of a matrix configuration may be arranged in an opposite direction to an adjacent plurality of diodes, and may have a structure in which a current provided to a plurality of heaters by the additional switches and the diodes may flow in a forward direction and a reverse direction. Accordingly, the number of control lines capable of controlling the heaters may be reduced, and even when the matrix configuration of the heating unit becomes more complicated, a structural complexity of the substrate treating apparatus including the heating unit may be effectively prevented.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In the specification, the singular forms include plural forms unless particularly mentioned. Also, the shapes or sizes of elements in a figure may be exaggerated for a clearer illustration.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and the disclosure of the application, and will neither become conceptual nor be construed to be excessively formal even though not clearly defined herein. The terms used herein are provided to describe the embodiments but not to limit the inventive concept. In the specification, the singular forms include plural forms unless particularly mentioned. The expressions 'include' and its various conjugated forms, such as 'including', which are used in the specification do not exclude existence or addition of one or more compositions, substances, elements, steps, operations, and devices.

The terms "unit", "part", and the like may be used to indicate a unit of processing at least one function or operation. For example, such terms may mean software, or a hardware element such as FPGA or ASIC. However, such terms are not limited to software or hardware. The "unit", "part", and the like may be configured to be included within an addressable storage medium or to operate one or more processors.

Thus, "unit", "part", and the like may include constituent elements such as software elements, Object-Oriented software elements, class elements, and task elements, processes, functions, attributes, procedures, sub-routines, segments of program code, drivers, firmware, micro code circuit, data, database, data structures, tables, arrays, and variables. Elements and functions provided within the "unit", "part", and the like may be divided into elements and "unit", "part" and the like, or may be jointed with other additional number of elements.

Hereinafter, an embodiment of the inventive concept will be described in more detail with reference to the accompanying drawings. The embodiment of the inventive concept may be modified into various forms, and the scope of the inventive concept should not be construed as being limited to the following embodiments. The present embodiment is provided to more fully explain the inventive concept to those with average knowledge in the art. Therefore, the shape of the elements in the drawings is exaggerated to emphasize a clearer explanation.

The substrate treating apparatus for manufacturing an integrated circuit device including a semiconductor device or a display device including a flat display device may include, but is not limited to, a deposition chamber, an etching chamber, a sputtering chamber, an application chamber, an exposing chamber, a developing chamber, a cleaning chamber, and a drying chamber. In the various process chambers, various processes including a deposition process, an etching process, a sputtering process, a deposition process, an exposing process, a developing process, a cleaning process, and a drying process may be performed on the substrate.

In general, a support unit in which the substrate is placed may be provided in the process chamber. The support unit may include a support plate capable of supporting the substrate and a heating unit capable of heating the substrate while a desired process is performed on the substrate. Optionally, the heating unit may be disposed in the support plate. The heating unit may have a matrix configuration including a plurality of heaters to heat the substrate. For example, the heating unit may include a plurality of heaters arranged in a matrix configuration to provide a plurality of heating regions, a plurality of diodes connected to the plurality of heaters, a controller capable of controlling the plurality of heaters, and a harness connecting the plurality of diodes to the controller.

Figure 1:
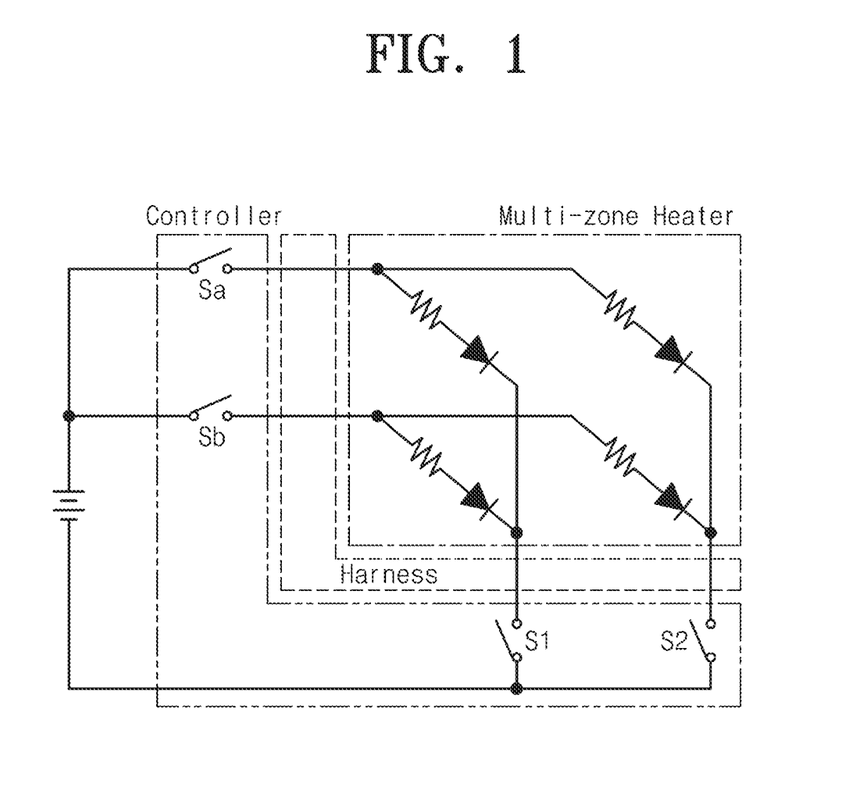
FIG. 1 is a circuit view illustrating a conventional heating unit.

FIG. 1 is a circuit view illustrating a conventional heating unit. In FIG. 1, a part indicated by a dash-single dotted line represents a plurality of heaters and a plurality of diodes, a part indicated by a dotted line represents a harness, and a part indicated by a dash-double dotted line represents a controller.

As shown in FIG. 1, the conventional heating unit has a configuration in which a plurality of diodes connected to a plurality of heaters are all arranged in one direction. In the conventional heating unit including switch Sa, switch Sb, switch S1, and switch S2, switch S1 and switch 2 are turned on to operate a heater positioned in a first column and the first row [1, 1].

The conventional heating unit having a 2×2 matrix configuration as shown in FIG. 1 requires four control lines as a whole to operate four heaters. Accordingly, if the conventional heating unit has a matrix configuration of N×N, 2N control lines are required to operate N×N heaters as a whole. As described above, when the number of heaters of the heating unit increases, wirings for electrical connections in the substrate treating apparatus including the heating unit may become complicated, a space for the heating unit may be increased, and a configuration complexity of the substrate treating apparatus may be increased. As a result, it may be difficult to implement the substrate treating apparatus including the heating unit due to these problems.

To solve the above-described problems, the heating unit according to exemplary embodiments of the inventive concept may have a structure in which adjacent diodes are arranged in opposite directions within a plurality of heating regions.

Figure 2:
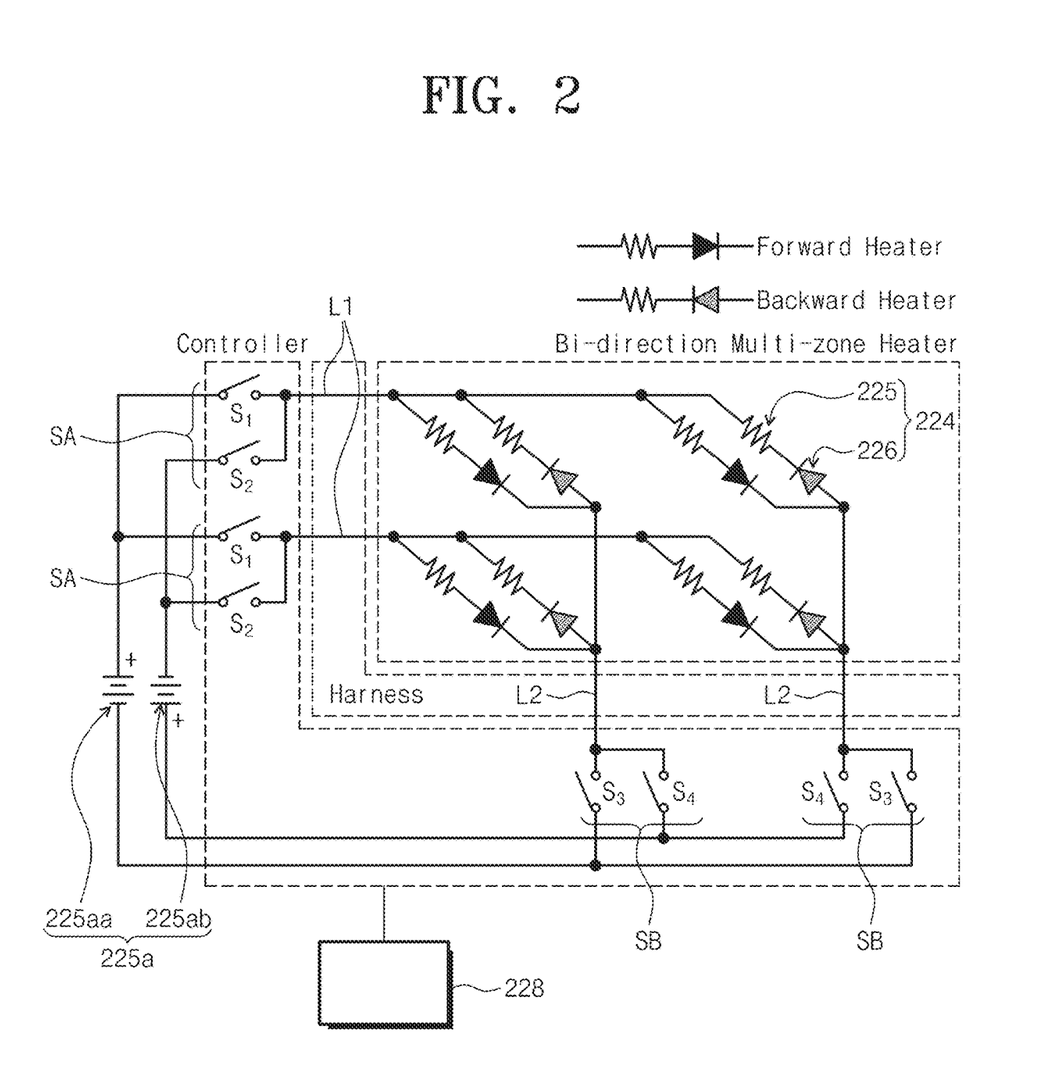
FIG. 2 is a circuit view illustrating a heating unit according to an embodiment of the inventive concept.

Referring to FIG. 2, the heating unit according to the inventive concept may include a plurality of heating members 224, a plurality of first power lines L1 and a plurality of second power lines L2 providing a path for supplying and returning a power to the plurality of heating members 224. According to an embodiment, the plurality of second power lines L2 may be connected to each of the plurality of first power lines L1 through the plurality of heating members 224. At least two heating members 224 may be connected to each of the first power lines L1, and at least two heating members 224 may be connected to each of the second power lines L2. At least two heating members 224 may be connected in parallel between each of the first power lines L1 and each of the second power lines L2.

According to an embodiment of this invention, the plurality of first power lines L1 and the plurality of second power lines L2 may be electrically connected through a heating member 224. In addition, the heating member 224 connecting any one of the plurality of first power lines L1 to any one of the plurality of second power lines L2 includes at least two heating members 224, thereby controlling a greater number of heating members 224 from the same number of control lines, thereby enabling a more precise control.

According to an embodiment, when there are L heating members 224 connected in parallel between each first power line L1 and each second power line L2, there are a number of N in the plurality of first power lines L1, and there are a number of M in the plurality of second power lines L2, so the total number provided may be N*M*L in the plurality of heating members 224. Referring to FIG. 2, there are two heating members 224 connected in parallel between each first power line L1 and each second power line L2, there are two pluralities of first power lines L1, and two pluralities of second power lines L2, so the total number provided may be 2*2*2 in the plurality of heating members 224.

According to an embodiment, a power supply unit 225a connected to the plurality of first power lines L1 and the plurality of second power lines L2 may be further included to supply a power to the plurality of heating members 224. The power supply unit 225a may be DC power.

According to an embodiment, the power supply unit 225a may include a same number of power sources 225aa and 225ab as a number of the at least two heating members 224 connected in parallel between the first power line L1 and the second power line L2. Accordingly, there is an effect of supplying a power to the diodes 226 flowing in different directions through each power source. According to an embodiment, two heating members 224 are provided, and two power sources 225aa and 225ab are provided. If three heating members 224 are provided, three power sources may be provided.

Each of the heating members 224 may include a heating element 225 and a diode 226 connected in series. In this case, at least two diodes 226 may be connected in parallel to each other at a point the plurality of first power lines L1 and the plurality of second power lines L2 intersect each other.

Referring to FIG. 2, two diodes 226 are connected in parallel at a point a first power line L1 and a second power line L2 intersect each other. In this case, the two diodes 226 may be connected to a corresponding heating element 225 such that a current flows in opposite directions with respect to the first power line L1 and the second power line L2.

That is, at least two heating members 224 electrically connecting the first power line L1 and the second power line L2 are provided, and each of the heating members 224 includes a heating element 225 and a diode 226, and in this case, the connected diodes 226 may be connected in opposite directions.

According to an embodiment of FIG. 2, a power unit 225a connected to a plurality of first power lines L1 and a plurality of second power lines L2 and including a first power source 225aa for supplying a power to the first heating member 224 and a second power source 225ab for supplying a power to the second heating member 224 may be disclosed. According to an embodiment, the first heating member may be a heating member including a heating element connected to a diode in a first direction, and the second heating member may be a heating member including a heating element connected to a diode in a second direction.

The heating unit may further include a switching element to allow a current to flow to the diode 226 connected in opposite directions.

According to an embodiment, a first power supply-return selection switching device SA connected between the power source 225a and the first power line L1 and a second power supply-return selection switching device SB connected between the power source 225a and the respective second power line L2 may be provided.

The first power supply-return selection switching device SA may include a first switching device S1 connected between the first power source 225aa and each first power line L1, and a second switching device S2 connected between the second power source 225ab and each first power line L1.

The second power supply-return selection switching device SB may include a third switching device S3 connected between the first power source 225aa and the second power line L2, and a fourth switching device S4 connected between the second power source 225ab and the second power line L2.

Each of the first power supply-return selection switching device SA and the second power supply-return selection switching device SB may be provided in a same number as a number of at least two heating members 224 connected in parallel between the first power line L1 and the second power line L2.

According to an embodiment, two heating members 224 connected in parallel between the first power line L1 and the second power line L2 are provided, and also two first power supply-return selection switching devices SA and two second power supply-return selection switching devices SB may be provided.

Each of the power supplies 225aa and 225ab of the power supply unit 225a may be connected between a corresponding first power supply-return selection switching device SA and a corresponding second power supply-return selection switching device SB.

According to an embodiment, a controller 228 for controlling an on/off of the first power supply-return selection switching device SA and the second power supply-return selection switching device SB may be further included. In the heating unit according to embodiments, the plurality of heaters and the plurality of diodes 226 may provide a plurality of heating regions, and the adjacent diodes 226 in the plurality of heating regions may be arranged in substantially opposite directions.

The controller 228 of the heating unit may control multiple switches to operate the plurality of heaters and the plurality of diodes 226 arranged in the opposite direction.

The heating unit according to the inventive concept may operate at least one desired heater among the plurality of heaters by additional switches without a substantial change in a harness structure and diodes 226 that may be arranged in the opposite direction. Accordingly, wirings for electrical connections of a substrate treating apparatus including a heating unit may be simplified, and the substrate treating apparatus may also have a simpler configuration. That is, in the conventional case, four heaters may be controlled using four control lines, that is, two power supply lines and two power return lines could be used to control four heaters, but in the inventive concept, eight heaters may be controlled using the same number of control lines, and thus more heaters may be accurately controlled.

Figure 3:
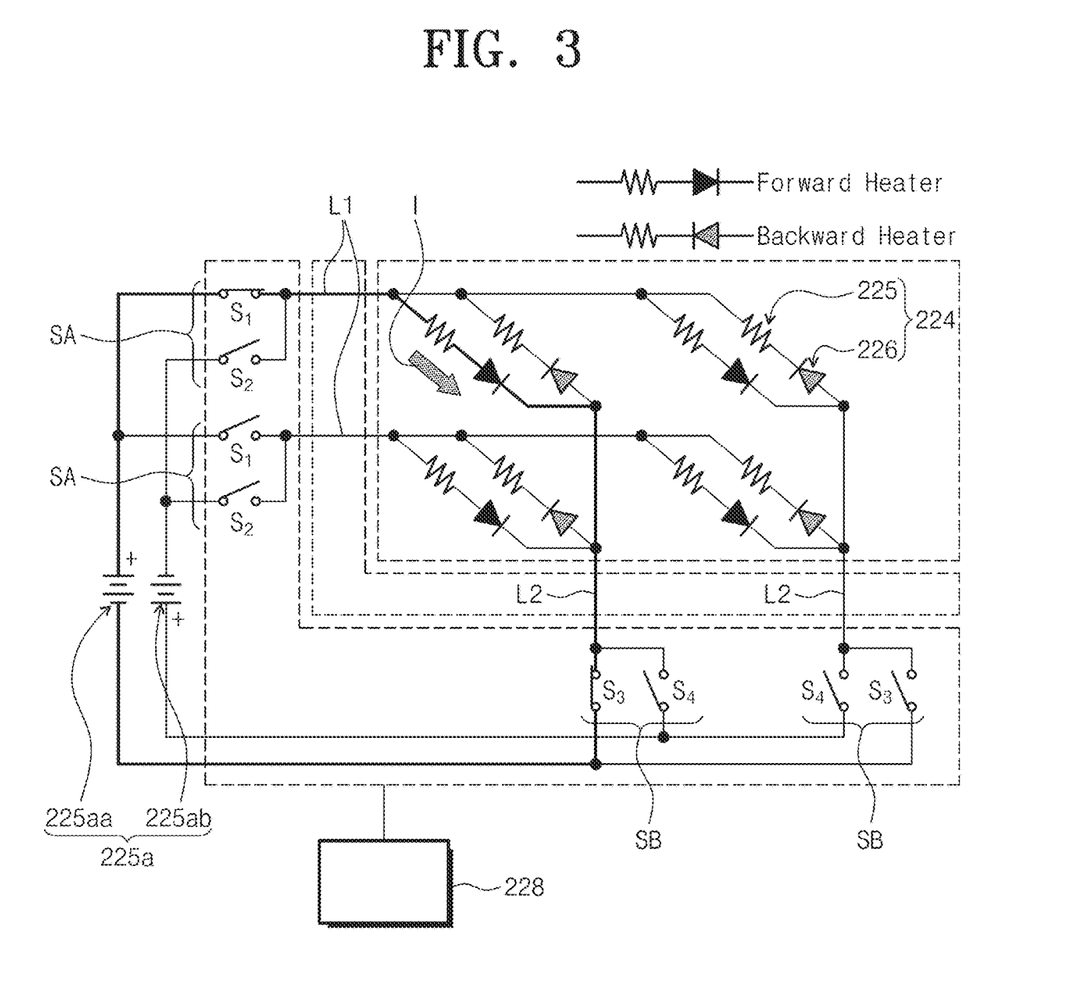
FIG. 3 and FIG. 4 are circuit views illustrating a method of controlling the heating unit according to embodiments of the inventive concept.
Figure 4:
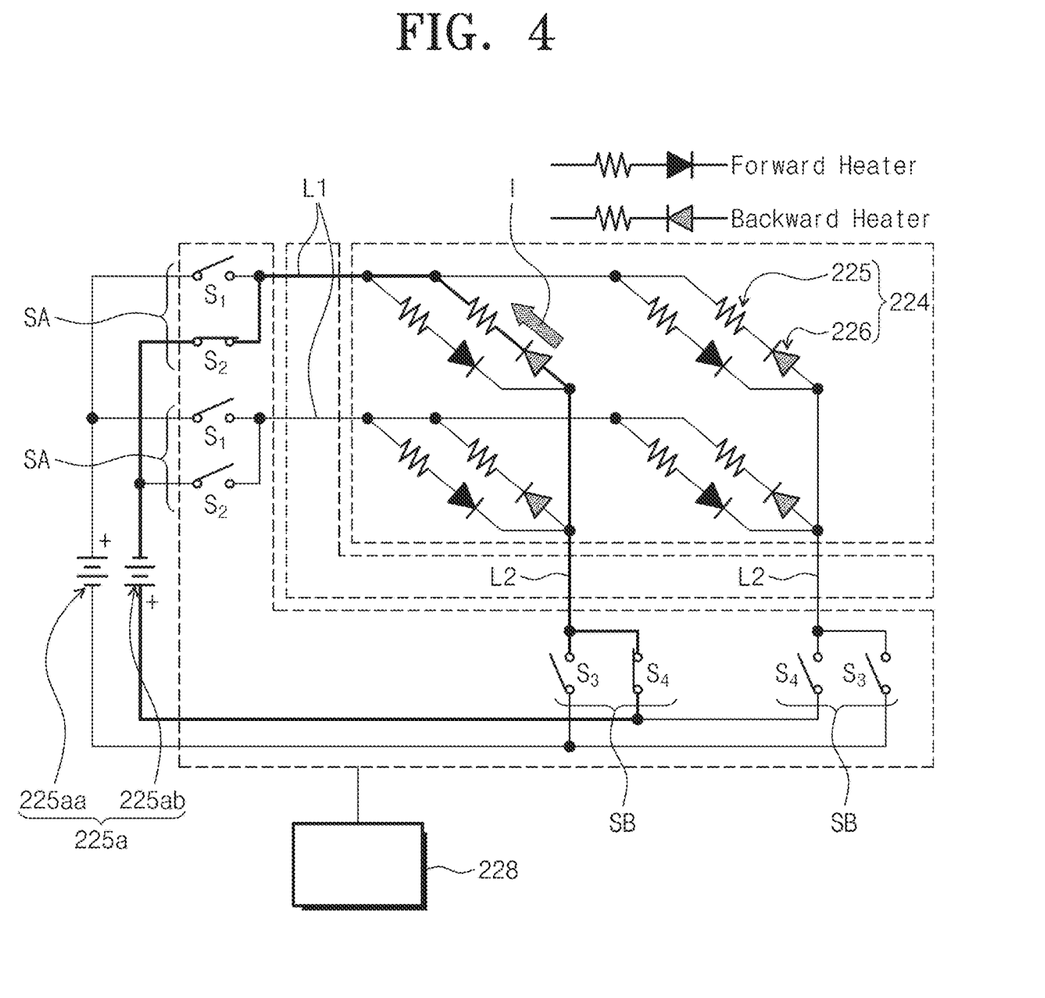

FIGS. 3 and 4 are circuit views illustrating a method of controlling a heating unit according to embodiments of the inventive concept.

FIG. 3 illustrates a configuration of switches for operating a heater in a first column and a first row [1, 1]. As illustrated in FIG. 3, when a controller 228 turns on a first switching device S1 connected to a first power line L1 at which the heater is positioned and a third switching device S3 connected to a second power line L2 at which the heater is positioned, as indicated by arrows I. In this case, a current in the heating unit may flow from a power source along a path including switch S1, the heater in the first column and the first row, and switch S3.

FIG. 4 illustrates a configuration of switches for operating a heater in a first row and a second column [1, 2]. The controller 228 may control the second switching device S2 connected to the first power line L1 where the heater is located and the fourth switching device S4 connected to the second power line L2 where the heater is located, so a flow to the heater of the first row and the second column may flow as indicated by arrow I. Here, a current in the heating unit may flow from a power source along a path including switch S4, the heater of the first row and the second column, and switch S2.

In the heating units illustrated in FIG. 3 and FIG. 4, a configuration of the heater used to allow the current to flow to the heater in the first row and the first column and the heater in the first row and the second column may be substantially the same. In this case, by reversing a direction of the current flowing through the harness and an arrangement direction of the adjacent diodes 226, the current may flow only to one or more desired heaters.

The heating unit of the matrix configuration according to embodiments may have a configuration in which a plurality of adjacent diodes 226 may be arranged in opposite directions, and the current provided to the plurality of heaters by additional switches and the diodes 226 may flow in a forward direction and a reverse direction. Accordingly, the number of control lines of the heaters can be reduced, and when the number of control lines is the same, more heaters can be controlled compared to the conventional one. As a result, even when the matrix configuration of the heating unit becomes more complicated, a structural complexity of the substrate treating apparatus including the heating unit may be effectively prevented.

Figure 5:
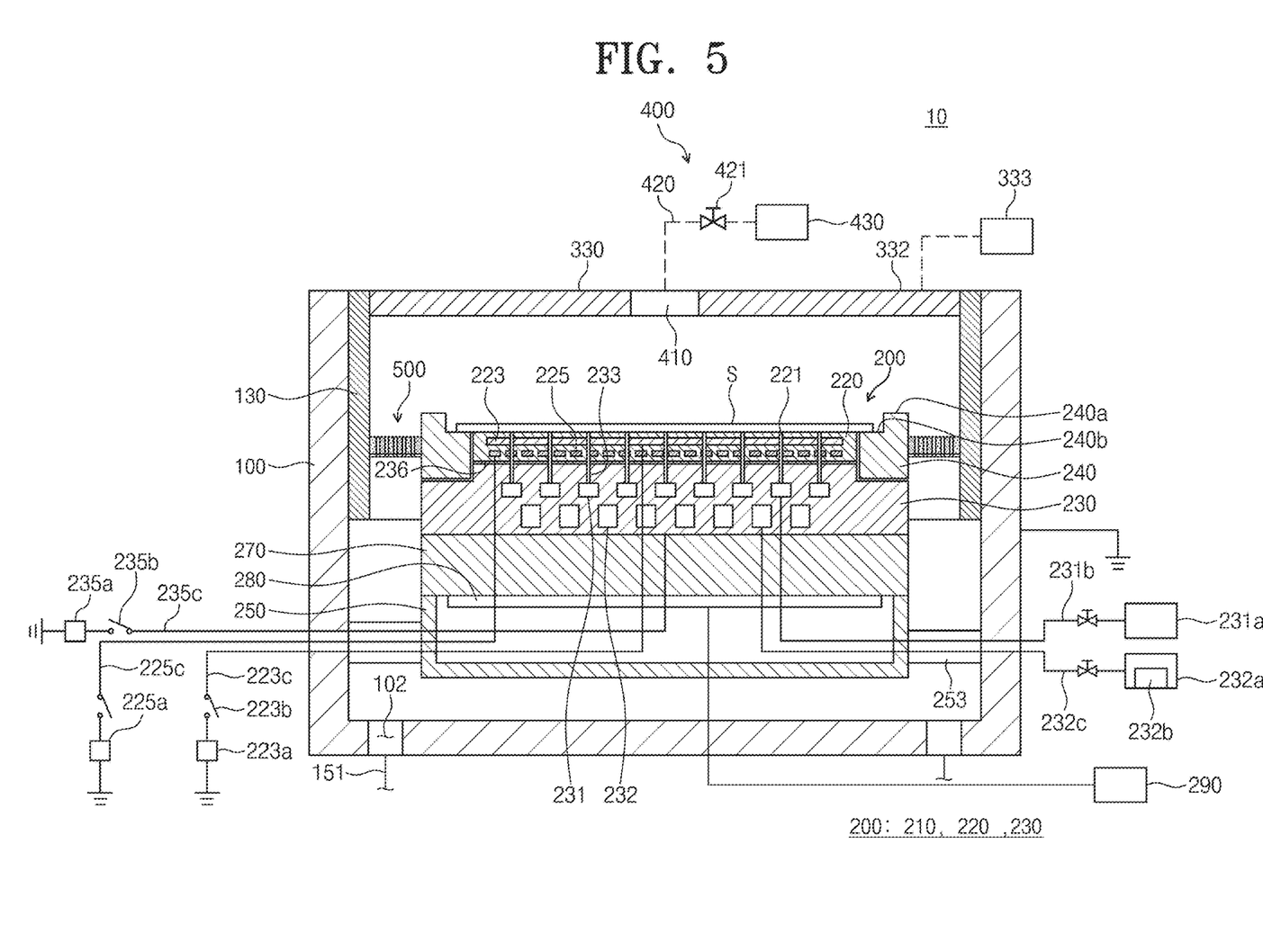
FIG. 5 is a plan view illustrating a substrate treating apparatus to which the heating unit is applied according to embodiments of the inventive concept.

FIG. 5 is a plan view illustrating a substrate treating apparatus to which a heating unit is applied according to embodiments of the inventive concept.

Referring the FIG. 5, the substrate treating apparatus 10 treats a substrate S using a plasma. For example, the substrate treating apparatus 10 may perform an etching process on the substrate S. The substrate treating apparatus 10 may include a chamber 100, a substrate support unit 200, a plasma generation unit 300, a gas supply unit 400, and an exhaust baffle 500.

The chamber 100 may provide a treating space in which a substrate treating process is performed. The chamber 100 may have a treating space therein and may be provided in a sealed shape. The chamber 100 may be made of a metal material. The chamber 100 may be made of an aluminum material. The chamber 100 may be grounded. An exhaust hole 102 may be formed on a bottom surface of the chamber 100. The exhaust hole 102 may be connected to an exhaust line 151. A reaction by-product generated during the process and a gas remaining in an inner space of the chamber may be discharged to an outside through the exhaust line 151. An inside of the chamber 100 may be depressurized to a predetermined pressure by the exhaust process.

According to an embodiment, a liner 130 may be provided inside the chamber 100. The liner 130 may have a cylindrical shape with an open top surface and an open bottom surface. The liner 130 may be provided to be in contact with an inner surface of the chamber 100. The liner 130 may protect an inner wall of the chamber 100 to prevent the inner wall of the chamber 100 from being damaged by the arc discharge. In addition, it is possible to prevent impurities generated during the substrate treating process from being deposited on the inner wall of the chamber 100.

The substrate support unit 200 may be positioned inside the chamber 100. The substrate support unit 200 may support the substrate S. The substrate support unit 200 may include an electrostatic chuck 210 that sucks the substrate S using an electrostatic force. Alternatively, the substrate support unit 200 may support the substrate S in various ways such as a mechanical clamping. Hereinafter, the substrate support unit 200 including the electrostatic chuck 210 will be described.

The substrate support unit 200 may include an electrostatic chuck 210, a bottom cover 250, and a plate 270. The substrate support unit 200 may be positioned inside the chamber 100 to be upwardly spaced apart from a bottom surface of the chamber 100.

The electrostatic chuck 210 may include a dielectric plate 220, a body 230, and a ring member 240. The electrostatic chuck 210 may support the substrate S. The dielectric plate 220 may be positioned at a top end of the electrostatic chuck 210. The dielectric plate 220 may be provided as a disk-shaped dielectric substance. The substrate S may be disposed on a top surface of the dielectric plate 220. The top surface of the dielectric plate 220 may have a radius smaller than that of the substrate S. Therefore, an edge region of the substrate S may be located outside the dielectric plate 220.

The dielectric plate 220 may include a first electrode 223, a heater 225, and a first supply fluid channel 221 therein. The first supply fluid channel 221 may be provided from a top surface to a bottom surface of the dielectric plate 210. A plurality of first supply fluid channel 221 are formed to be spaced apart from each other, and may be provided as a passage through which a heat transfer medium is supplied to a bottom surface of the substrate S.

The first electrode 223 may be electrically connected to a first power source 223a. The first power source 223a may include a DC power.

A switch 223b may be installed between the first electrode 223 and the first power source 223a. The first electrode 223 may be electrically connected to the first power source 223a by on/off of the switch 223b. When the switch 223b is turned on, a DC current may be applied to the first electrode 223. An electrostatic force is applied between the first electrode 223 and the substrate S by a current applied to the first electrode 223, and the substrate S may be sucked to the dielectric plate 220 by the electrostatic force. The heater 225 may be located below the first electrode 223. The heater 225 may be electrically connected to the second power source 225a. The heater 225 may generate a heat by resisting a current applied from the second power source 225a. A generated heat may be transferred to the substrate S through the dielectric plate 220. The substrate S may be maintained at a predetermined temperature by the heat generated by the heater 225. The heater 225 may include a spiral shape coil. The heater 225 may be provided in a heating unit form.

The body 230 may be positioned below the dielectric plate 220. The bottom surface of the dielectric plate 220 and the top surface of the body 230 may be bonded by an adhesive 236. The body 230 may be made of an aluminum material. The top surface of the body 230 may be positioned such that a central region is higher than the edge region. The central region of the top surface of the body 230 has an area corresponding to the bottom surface of the dielectric plate 220 and may be adhered to the bottom surface of the dielectric plate 220. The body 230 may have a first circulation fluid channel 231, a second circulation fluid channel 232, and a second supply fluid channel 233 formed therein.

The first circulation fluid channel 231 may be provided as a channel through which the heat transfer medium circulates. The first circulation fluid channel 231 may be formed in a spiral shape inside the body 230. Alternatively, the first circulation fluid channel 231 may be disposed such that ring-shaped channels having different radii have the same center. Each of the first circulation fluid channel 231 may communicate with each other. The first circulation fluid channel 231 may be formed at the same height.

The second fluid channel 232 may be provided as a channel through which a cooling fluid circulates. The second circulation fluid channel 232 may be formed in a spiral shape inside the body 230. Alternatively, the second circulation fluid channel 232 may be disposed such that ring-shaped channels having different radii have the same center. Each of the second circulation fluid channel 232 may communicate with each other. The second circulation fluid channel 232 may have a cross-sectional area greater than that of the first circulation fluid channel 231. The second circulation fluid channel 232 may be formed at the same height. The second circulation fluid channel 232 may be located below the first circulation fluid channel 231.

The second supply fluid channel 233 may upwardly extend from the first circulation fluid channel 231 and may be provided to a top surface of the body 230. The second supply fluid channel 243 may be provided in a number corresponding to the first supply fluid channel 221, and may connect the first circulation fluid channel 231 to the first supply fluid channel 221.

The first circulation fluid channel 231 may be connected to a heat transfer medium storage unit 231a through a heat transfer medium supply line 231b. The heat transfer medium may be stored in the heat transfer medium storage unit 231a. The heat transfer medium may include an inert gas. According to an embodiment, the heat transfer medium may include a helium He gas. The helium gas may be supplied to the first circulation fluid channel 231 through the supply line 231b, and may be supplied to the bottom surface of the substrate S through the second supply fluid channel 233 and the first supply fluid channel 221 sequentially. The helium gas may serve as a medium through which a heat transferred from the plasma to the substrate S is transferred to the electrostatic chuck 210.

The second circulation fluid channel 232 may be connected to a cooling fluid storage unit 232a through a cooling fluid supply line 232c. The cooling fluid may be stored in the cooling fluid storage unit 232a. A cooler 232b may be provided within the cooling fluid storage unit 232a. The cooler 232b may cool the cooling fluid to a predetermined temperature. Alternatively, the cooler 232b may be installed at the cooling fluid supply line 232c. The cooling fluid supplied to the second circulation fluid channel 232 through the cooling fluid supply line 232c may circulate along the second circulation fluid channel 232 to cool the body 230. The body 230 may cool the dielectric plate 220 and the substrate S together to maintain the substrate S at a predetermined temperature.

The body 230 may include a metal plate. In an embodiment, all of the body 230 may be provided as a metal plate.

A ring member 240 may be disposed in an edge region of the electrostatic chuck 210. The ring member 240 may have a ring shape and may be disposed along the circumference of the dielectric plate 220. The ring member 240 may be formed of many rings including a focus ring. A top surface of the ring member 240 may be positioned such that an outer portion 240a is higher than an inner portion 240b. The top surface inner portion 240b of the ring member 240 may be positioned at the same height as the top surface of the dielectric plate 220. The inner portion 240b of the top surface of the ring member 240 may support the edge region of the substrate S positioned outside the dielectric plate 220.

An outer portion 240a of the ring member 240 may be provided to surround an edge region of the substrate S. The ring member 240 may control an electromagnetic field so that a plasma density is uniformly distributed in an entire region of the substrate S. Accordingly, the plasma is uniformly formed over the entire region of the substrate S, so that each region of the substrate S may be uniformly etched.

The bottom cover 250 may be located at a bottom end of the substrate support unit 200. The bottom cover 250 may be positioned to be upwardly spaced apart from the bottom surface of the chamber 100. The bottom cover 250 may have a space 255 having an open top surface formed therein.

An outer radius of the bottom cover 250 may have a same length as an outer radius of the body 230. In an inner space 255 of the bottom cover 250, a lift pin module (not shown) or the like for moving a returned substrate S from an external transfer member to the electrostatic chuck 210 may be positioned. The lift pin module (not shown) may be spaced apart from the bottom cover 250 by a predetermined distance. A bottom surface of the bottom cover 250 may be made of a metal material. In the inner space 255 of the bottom cover 250, air may be provided. Since air has a dielectric constant lower than that of an insulator, it may serve to reduce the electromagnetic field inside the substrate support unit 200.

The bottom cover 250 may have a connection member 253. The connection member 253 may connect the outer surface of the bottom cover 250 to the inner wall of the chamber 100. A plurality of connection members 253 may be provided at the outer surface of the bottom cover 250 at regular intervals. The connection member 253 may support the substrate support unit 200 inside the chamber 100. In addition, the connection member 253 may be connected to the inner wall of the chamber 100 so that the bottom cover 250 is electrically grounded. A first power line 223c connected to the first power source 223a, a second power line 225c connected to the second power source 225a, a third power line 235c connected to the third power source 235a, and a heat transfer medium supply line 231b connected to the heat transfer medium storage unit 231a, etc may be extended within the bottom cover 250 through the inner space 255 of the connecting line.

A plate 270 may be positioned between the electrostatic chuck 210 and the bottom cover 250. The plate 270 may cover a top surface of the bottom cover 250. The plate 270 may be provided with a cross-sectional area corresponding to the body 230. The plate 270 may include an insulator. According to an embodiment, one or more plates 270 may be provided. The plate 270 may serve to increase an electrical distance between the body 230 and the bottom cover 250.

The support unit 200 according to the inventive concept may further include a control board 290, a connection board 280, and a connection electrode unit 227.

The control board 290 according to the inventive concept may control a first switching device S1, a second switching device S2, a third switching device S3, and a fourth switching device S4 connected to a heating unit having a matrix configuration included in the support unit 200 according to the inventive concept. According to an embodiment, a control board 290 according to the inventive concept may include a controller 228. The control board 290 may generate and apply a control signal for controlling the first switching device S1, the second switching device S2, the third switching device S3, and the fourth switching device S4 connected to the heating unit having a matrix configuration included in the support unit according to the inventive concept. The control signal may be a digital signal, for example, an on/off signal. The control board 290 may be implemented as a computer or a similar device using a hardware, a software, or a combination thereof.

In the hardware, the control board 290 can be implemented with application specific integrated circuits (ASICs), digital signal processors (DSPs), digital signal processing devices (DSPDs), programmable logic devices (PLDs), field programmable gate arrays (FPGAs), processors, microcontrollers, microprocessors, or electrical devices performing a similar control function.

In the software, the control board 290 may be implemented as a software code or a software application according to one or a plurality of program languages. The software may be executed by a hardware-implemented controller. In addition, the software may be transmitted from an external device such as a server to the above-described hardware configuration and installed.

According to an embodiment, the connection board 280 may be disposed between the heater 225 and the control board 290. According to an embodiment, the connection electrode unit 227 may electrically connect the heater 225, the control board 290, and the connection board 280. The connection electrode unit 227 may include a first power line and a second power line.

The plasma generation unit 300 may excite the process gas in the chamber 100 in a plasma state. The plasma generation unit 300 may use a capacitive coupled plasma type plasma source. When a CCP type plasma source is used, the chamber 100 may include a top electrode 330 and a bottom electrode 230, that is, a body. The top electrode 330 and the bottom electrode 230 may be vertically disposed parallel to each other with a treating space interposed therebetween. The top electrode 330 as well as the bottom electrode 230 may receive an energy for generating a plasma by receiving an RF signal by the RF power source 310, and the number of RF signals applied to each electrode is not limited to one as shown. An electric field is formed in a space between both electrodes, and the process gas supplied to the space may be excited to a plasma state. A substrate treating process is performed using this plasma. Although described as a capacitively coupled plasma (CCP) type described in this specification, the inventive concept is not limited thereto, and the plasma generation unit 600 may be formed as an inductively coupled plasma (ICP) type.

The plasma generation unit 300 may be provided with a gas dispersion plate. Although not shown in the drawings, the gas dispersion plate may be disposed to be spaced apart from a top surface of the chamber 100 by a predetermined distance. The gas dispersion plate may be fixed by a support portion formed on a top edge of the chamber 100. The gas dispersion plate may be provided in a plate shape having a constant thickness. The bottom surface of the gas dispersion plate may be anodized to prevent a generation of an arc due to a plasma. A cross-sectional area of the gas dispersion plate may be provided equal to a cross-sectional area of the substrate support unit 200. The gas dispersion plate includes a plurality of injection holes. An injection hole may penetrate a top surface and a bottom surface of the gas dispersion plate in a vertical direction. The gas dispersion plate 310 may include a metal material. The metal gas dispersion plate 310 may function as a top electrode.

The gas supply unit 400 may supply the process gas into the chamber 100. The gas supply unit 400 may include a gas supply nozzle 410, a gas supply line 420, and a gas storage unit 430. The gas supply nozzle 410 may be installed at a center of the top surface of the chamber 100. A spray hole may be formed at a bottom surface of the gas supply nozzle 410. The spray hole may supply the process gas into the chamber 100. The gas supply line 420 may connect the gas supply nozzle 410 and the gas storage unit 430. The gas supply line 420 may supply the process gas stored at the gas storage unit 430 to the gas supply nozzle 410. A valve 421 may be installed at the gas supply line 420. The valve 421 may open and close the gas supply line 420 and control a flow rate of the process gas supplied through the gas supply line 420.

An exhaust unit 500 may be positioned between an inner wall of the chamber 100 and the substrate support unit 200. A baffle 510 may be provided in an annular ring shape. A plurality of through holes 511 may be formed at the baffle 510. The process gas provided in the chamber 100 may pass through the through holes 511 of the baffle 510 and may be exhausted through the exhaust hole 102. A flow of the process gas may be controlled according to a form of the baffle 510 and a form of the through holes.

The substrate treating apparatus shown in FIG. 5 is only an embodiment, and the substrate treating apparatus may include a plurality of process chambers. For example, the plurality of process chambers may include an etching chamber, a deposition chamber, a sputtering chamber, an application chamber, an exposing chamber, a developing chamber, a cleaning chamber, a drying chamber, and the like, in which various processes may be performed to manufacture an integrated circuit device including a semiconductor device or a flat display device. Desired processes including a deposition process, a sputtering process, an etching process, a coating process, an exposure process, a development process, a cleaning process, a drying process, and the like may be performed within the process chambers. A support unit in which the substrate is placed may be provided in the process chamber, and the support unit may include a support plate capable of supporting the substrate and a heating unit capable of heating the substrate while a desired process is performed on the substrate.

The heating unit may have a matrix configuration as described with reference to FIG. 2 to heat the substrate. In other words, to provide a plurality of heating regions to heat the substrate, the heating unit may include a plurality of heaters, a plurality of diodes each connectable to the plurality of heaters, a controller including a plurality of switches to control the plurality of heaters, and a harness which can connect the plurality of heaters and the plurality of diodes to the controller. Here, the heating unit may have a configuration in which a plurality of adjacent diodes may be arranged in opposite directions and a current provided to the plurality of heaters may flow in a forward direction and a reverse direction by additional switches, thereby reducing the number of control lines of the heating unit. Accordingly, it is possible to prevent a phenomenon in which the substrate treating apparatus including the heating unit becomes structurally complicated.

Figure 6:
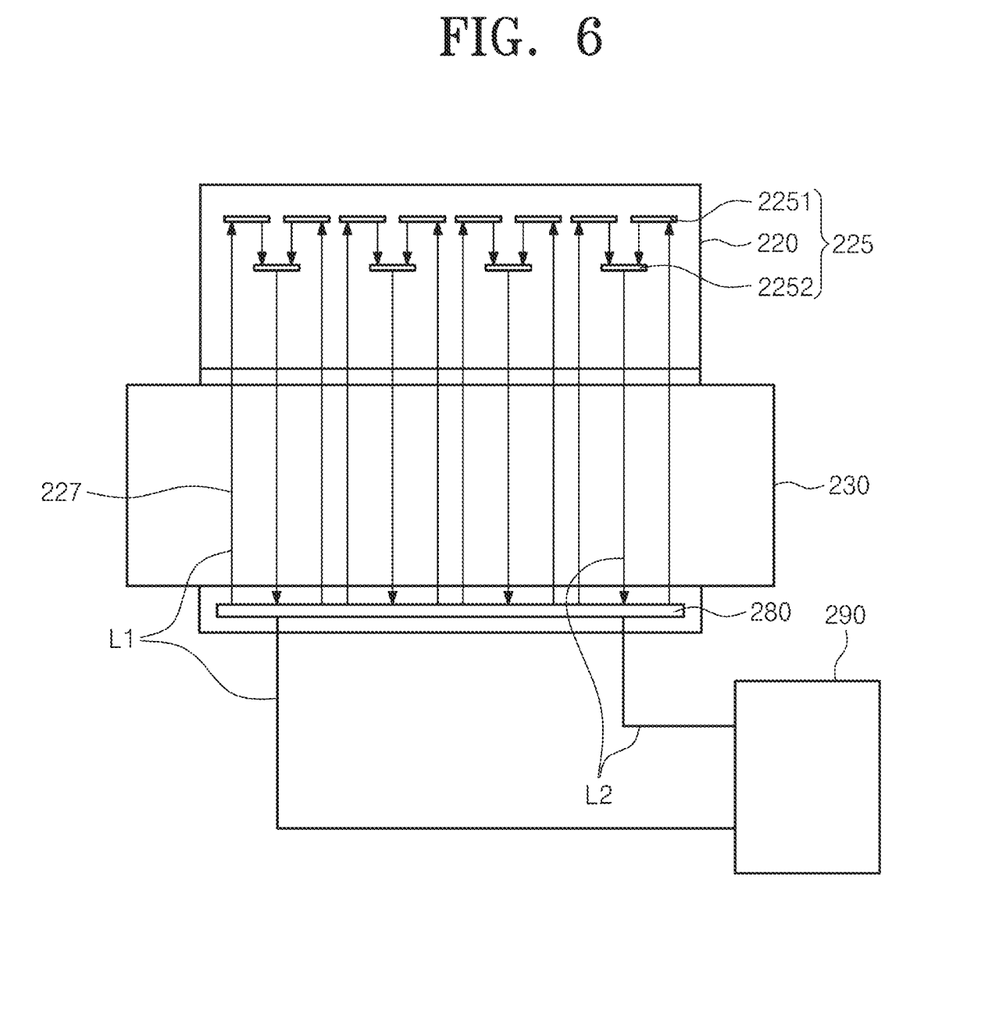
FIG. 6 is a plan view illustrating the substrate treating apparatus to which the heating unit is applied according to another embodiment of the inventive concept.

FIG. 6 is a plan view illustrating a substrate treating apparatus to which a heating unit is applied according to another embodiment of the inventive concept.

Referring to FIG. 6, a plurality of heaters included in the heating unit may include a first heater 2251 for heating an edge of a substrate. According to an embodiment, the first heater 2251 heating the edge of the substrate may be a heater for precision control.

According to an embodiment of FIG. 6, the plurality of heaters included in the heating unit may include the first heater 2251 for heating the edge of the substrate and a second heater 2252 for heating a center part of the substrate. According to an embodiment, the first heater 2251 for heating the edge of the substrate may be a heater for precision control, and the second heater 2252 for heating the center part of the substrate may be a heater for rough control. According to an embodiment, after performing an overall temperature control using the second heater 2252, a precision control for each region may be performed using the first heater 2251.

According to an embodiment of FIG. 5 to FIG. 6, a first power line may be provided embedded in the connection board 280. According to another embodiment of the inventive concept, the first power line may be embedded in the plate 220 including the heating unit, and may be embedded and provided on a plane such as the heating unit.

The above embodiments are provided to help an understanding of the inventive concept, and the scope of the inventive concept is not limited, and it should be understood that various deformable embodiments also fall within the scope of the inventive concept. The drawings provided in the inventive concept are merely illustrative of an optimal embodiment of the inventive concept. The technical protection scope of the inventive concept should be determined by the technical idea of the claims, and it should be understood that the technical protection scope of the inventive concept is not limited to the literal description of the claims itself, but is substantially equivalent.

What is claimed is:

1. A support unit for supporting a substrate, the support unit comprising:
    a heating unit for heating the substrate, and
    wherein the heating unit comprises,
    a plurality of heating members;
    a plurality of first power lines and a plurality of second power lines providing a supply and return pathway for a power to and from the plurality of heating members,
    wherein the plurality of second power lines are connected to each of the plurality of first power lines through the plurality of heating members;
    at least two heating members are connected to each first power line and at least two heating members are connected to each second power line; and
    a power unit connected to the plurality of first power lines and the plurality of second power lines for supplying the power to the plurality of heating members, the power unit includes a power source provided in a same number as the at least two heating members connected in parallel between each first power line and each second power line, and
    wherein at least two heating members are connected in parallel between each first power line and each second power line.

2. The support unit of claim 1, wherein there are L heating members connected in parallel between each first power line and each second power line, there are N of the plurality of first power lines, and there are M of the plurality of second power lines, and
    wherein a total number of the plurality of heating members is N*M*L.

3. The support unit of claim 1, wherein each heating member includes a heating element and a diode connected in series, and
    at least two diodes are connected in parallel to each other at a point each of the plurality of first power lines and each of the plurality of second power lines each cross with each other, and
    the at least two diodes are connected to a corresponding heating element such that a current flows in an opposite direction with respect to each first power line and each second power line.

4. The support unit of claim 1, wherein the heating unit further comprises:
    a first power supply-return selection switching element connected between the power unit and each first power line; and
    a second power supply-return selection switching element connected between the power unit and each second power line.

5. The support unit of claim 4, wherein each of the first power supply-return selection switching element and the second power supply-return selection switching element is provided in a same number as the least two heating members connected in parallel between each first power line and each second power line.

6. The support unit of claim 5, wherein each power source of the power unit is connected between a corresponding first power supply-return selection switching element and a corresponding second power supply-return switching element.

7. The support unit of claim 4, further comprising a controller for controlling an on/off of the first power supply-return selection switching element and the second power supply-return selection switching element.

8. The support unit of claim 1, wherein the at least two heating members connected in parallel between each first power line and each second power line includes a first heating member and a second heating member, and
    wherein the power unit includes a first power source for supplying a power to the first heating member and a second power source for supplying a power to the second heating,
    wherein the heating unit further comprises,
    a first power supply-return selection switching element including a first switching element connected between the first power source and each first power line and a second switching element connected between the second power source and each first power line; and
    a second power supply-return selection switching element including a third switching element connected between the first power source and each second power line and a fourth switching element connected between the second power source and each second power line.

9. The support unit of claim 8, where the first heating member and the second heating member each include a heating member and a diode connected in series, and
    a diode of the first heating member and a diode of the second heating member are connected to a corresponding heating member such that a current flows in an opposite direction with respect to each first power line which is commonly connected.

10. The support unit of claim 8, further comprising a controller controlling an on/off of the first power supply-return selection switching element and the second power supply-return selection switching element.

11. A heating unit comprising:
a plurality of heating line assemblies;
a plurality of first power lines connected to any one of the plurality of heating line assemblies;
a plurality of second power lines connected to any one of the plurality of heating line assemblies;
a first power source provided so a current is supplied to a first power line of the plurality of first power lines and so a current returns to a second power line of the plurality of second power lines; and
a second power source provided so a current is supplied to the second power line and so a current returns to the first power line; and
wherein only one heating line assembly simultaneously connected to any one first power line among the plurality of first power lines and any one second power line among the plurality of second power lines is provided, and
wherein each heating line assembly comprises,
a first heating line;
a second heating line connected in parallel to the first heating line;
a first heater provided at the first heating line;
a second heater provided at the second heating line;
a first diode connected in series to the first heater at the first heating line;
a second diode connected in series to the second heater at the second heating line; and
a switch unit for controlling an on/off of the first heater and the second heater included in the heating line assembly.

12. The heating unit of claim 11, wherein the first diode and the second diode included in the heating line assembly are connected so a current flowing in the first heater and a current flowing in the second heater flow in opposite directions with each other.

13. The heating unit of claim 12, wherein the switch unit comprises:
a first power supply-return selection switching element including a first switching element connected between the first power source and each first power line and a second switching element connected between the second power source and each first power line; and
a second power supply-return selection switching element including a third switching element connected between the first power source and each second power line and a fourth switching element connected between the second power source and each second power line.

14. The heating unit of claim 13 further comprising:
a controller for controlling an on/off of the first switching element, the second switching element, the third switching element and the fourth switching element.

15. A substrate treating apparatus comprising:
a process chamber having a treating space;
a support unit positioned within the treating space and supporting a substrate;
a heating unit provided at the support unit and according to claim 11;
a gas supply unit for supplying a gas for treating the substrate in the treating space; and
a plasma generating unit for generating a plasma from the gas.

16. The substrate treating apparatus of claim 15, wherein the support unit further comprises a connection board which may be embedded with at least one of the plurality of first power lines and the plurality of second power lines.

17. The substrate treating apparatus of claim 15, wherein the plurality of first power lines and the plurality of second power lines are embedded on a same place as the heating unit.

18. The substrate treating apparatus of claim 15, wherein the plasma generating unit includes a gas dispersion plate fixed to the process chamber by the support unit.

19. The substrate treating apparatus of claim 18, wherein a bottom surface of the gas dispersion plate is anodized to prevent an arc generation by the plasma.

* * * * *